(12) United States Patent
Kim et al.

(10) Patent No.: US 11,075,059 B2
(45) Date of Patent: Jul. 27, 2021

(54) DEPOSITION APPARATUS INCLUDING CLEANING GAS VALVE UNIT AND DEPOSITION METHOD INCLUDING THE SAME

(71) Applicant: SAMSUNG DISPLAY CO., LTD., Yongin-si (KR)

(72) Inventors: Junggon Kim, Hwaseong-si (KR); Sunghun Key, Seoul (KR); Choelmin Jang, Seoul (KR); Myungsoo Huh, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 134 days.

(21) Appl. No.: 16/239,874

(22) Filed: Jan. 4, 2019

(65) Prior Publication Data

US 2019/0206659 A1    Jul. 4, 2019

(30) Foreign Application Priority Data

Jan. 4, 2018  (KR) .................. 10-2018-0001123

(51) Int. Cl.
*H01J 37/32* (2006.01)
*C23C 16/455* (2006.01)

(52) U.S. Cl.
CPC .. *H01J 37/32449* (2013.01); *C23C 16/45563* (2013.01); *H01J 37/32834* (2013.01); *H01J 37/32862* (2013.01)

(58) Field of Classification Search
CPC .......... H01J 37/32449; H01J 37/32862; H01J 37/32834; C23C 16/45563; C23C 16/45544; C23C 16/4408; A47L 19/04

USPC ................. 118/715; 156/345.33, 345.34
See application file for complete search history.

(56) References Cited

U.S. PATENT DOCUMENTS

| | | | |
|---|---|---|---|
| 8,182,608 B2 | 5/2012 | Kerr et al. | |
| 8,328,939 B2 | 12/2012 | Choi et al. | |
| 9,184,410 B2 | 11/2015 | Visser et al. | |
| 9,627,185 B2 | 4/2017 | Huston et al. | |
| 2003/0170390 A1* | 9/2003 | Derraa ............... | C23C 16/4408 427/255.28 |

(Continued)

FOREIGN PATENT DOCUMENTS

| | | |
|---|---|---|
| KR | 1020090013286 | 2/2009 |
| KR | 101046248 | 6/2011 |
| KR | 1020160094424 | 8/2016 |

*Primary Examiner* — Rudy Zervigon
(74) *Attorney, Agent, or Firm* — F. Chau & Associates, LLC

(57) ABSTRACT

A deposition apparatus includes a deposition gas supply unit including an opening and closing valve. The deposition gas supply unit is configured to selectively supply a source gas or a mixture gas into a chamber. A cleaning gas supply unit is configured to supply a cleaning gas into the chamber. A deposition head includes a first deposition head including a first nozzle configured to supply the source gas and the cleaning gas and a second deposition head including a second nozzle configured to supply the source gas, the mixture gas, and the cleaning gas. An exhaust unit is configured to discharge the cleaning gas and remaining source and mixture gases from the chamber. A cleaning gas valve unit is configured to be selectively opened and closed to supply the cleaning gas to at least any one of the first deposition head and the second deposition head.

14 Claims, 5 Drawing Sheets

(56) References Cited

U.S. PATENT DOCUMENTS

| | | | |
|---|---|---|---|
| 2004/0099213 A1* | 5/2004 | Adomaitis | C23C 16/52 118/715 |
| 2009/0035941 A1 | 2/2009 | Park et al. | |
| 2010/0068375 A1 | 3/2010 | Kawakami | |

* cited by examiner

DEPOSITION APPARATUS INCLUDING CLEANING GAS VALVE UNIT AND DEPOSITION METHOD INCLUDING THE SAME

CROSS-REFERENCE TO RELATED APPLICATION

This application claims priority under 35 U.S.C. § 119 to Korean Patent Application No. 10-2018-0001123, filed on Jan. 4, 2018, in the Korean Intellectual Property Office (KIPO), the disclosure of which is incorporated by reference herein in its entirety.

1. TECHNICAL FIELD

Exemplary embodiments of the present invention relate to a deposition apparatus including a cleaning gas valve unit, and more particularly to a deposition method including the same.

2. DISCUSSION OF RELATED ART

Various types of thin films have been formed in the fields of semiconductors, displays, and solar cells. The formation of thin films can be implemented using deposition or photolithography.

As an example, thin film deposition methods include atomic layer deposition (ALD), or chemical vapor deposition (CVD) using a chemical reaction.

ALD may form a thin film having a thickness of the order of an atomic size on a substrate by sequentially introducing/discharging source gases in a gaseous state.

CVD may transfer a deposition material in a gaseous form to the surface of a substrate and deposit a thin film on the surface of the substrate through the reaction of a gas.

A hybrid deposition apparatus may perform a process in which a thin film is formed using ALD in a first deposition head including a first nozzle configured to supply a first source gas and a second nozzle configured to supply a second source gas and a thin film may be formed using CVD in a second deposition head.

In the hybrid method, in situ-cleaning in the second deposition head may be performed instead of the cleaning of all the nozzles. In this case, the cleaning gas of the second deposition head may be transferred to the first deposition head, and then the first deposition head may be cleaned.

SUMMARY

Exemplary embodiments of the present invention provide a deposition apparatus and a deposition method which are capable of cleaning individual nozzles of each deposition head while selectively cleaning individual deposition heads.

According to an exemplary embodiment of the present invention, a deposition apparatus includes a deposition gas supply unit including an opening and closing valve. The deposition gas supply unit is configured to selectively supply a source gas or a mixture gas into a chamber. A cleaning gas supply unit is configured to supply a cleaning gas into the chamber. A deposition head includes a first deposition head including a first nozzle configured to supply the source gas and the cleaning gas and a second deposition head including a second nozzle configured to supply the source gas, the mixture gas, and the cleaning gas. An exhaust unit is configured to discharge the cleaning gas and remaining source and mixture gases from the chamber. A cleaning gas valve unit is configured to be selectively opened and closed to supply the cleaning gas to at least any one of the first deposition head and the second deposition head.

The cleaning gas valve unit may include a first cleaning gas valve configured to selectively supply the cleaning gas to the first deposition head. The cleaning gas valve unit may include a second cleaning gas valve configured to selectively supply the cleaning gas to the second deposition head.

The first deposition head may include the first nozzle configured to selectively supply a first source gas and the cleaning gas. T second nozzle may be configured to selectively supply a second source gas different from the first source gas.

The second deposition head may include a third nozzle configured to supply the mixture gas and the cleaning gas.

The deposition apparatus may include a first curtain nozzle disposed between the first deposition head and the second deposition head and configured to supply a curtain gas.

The first deposition head may include a second curtain nozzle disposed between the first nozzle and the second nozzle and configured to supply a curtain gas.

The exhaust unit may include a first exhaust unit disposed adjacent to the first nozzle. The exhaust unit may include a second exhaust unit disposed adjacent to the second nozzle. The exhaust unit may include a third exhaust unit disposed adjacent to the second deposition head.

The cleaning gas valve unit may be selectively opened and closed to selectively supply the cleaning gas to the first deposition head or the second deposition head.

The cleaning gas valve unit may be opened to substantially simultaneously supply the cleaning gas to both the first deposition head and the second deposition head.

When the first nozzle of the first deposition head is opened to supply the cleaning gas, only the first exhaust unit may be opened, or both the first and second exhaust units may be opened.

When a third nozzle of the second deposition head is opened to supply the cleaning gas, the third exhaust unit may be opened.

When both the first nozzle of the first deposition head and the third nozzle of the second deposition head are substantially simultaneously opened to supply the cleaning gas, the second exhaust unit may be opened.

According to an exemplary embodiment of the present invention, a deposition method includes selecting a method of depositing a film through the supply of a source gas or a method of depositing a film through the supply of a mixture gas. When the method of depositing a film through the supply of a source gas is selected, a film is deposited on the object by introducing the source gas. Cleaning is performed by supplying a cleaning gas. Depositing the film includes a first introduction step including opening an opening and closing valve included in a gas supply unit and supplying a first source gas. Depositing the thin film includes a second introduction step including opening the opening and closing valve included in the gas supply unit and supplying a second source gas. Performing the cleaning includes, during or after the first and second introduction steps, opening a cleaning gas valve unit and supplying the cleaning gas. Performing the cleaning includes opening an exhaust unit and cleaning the deposition head while eliminating remaining first and second source gases.

The first source gas may be supplied to the first nozzle of the first deposition head at the first introduction step. The second source gas may be supplied to the second nozzle of the first deposition head at the second introduction step.

The first source gas may be supplied to a first nozzle and a second nozzle of the first deposition head at the first introduction step. The second source gas may be supplied to a third nozzle of the second deposition head at the second introduction step.

In performing the cleaning, when the first nozzle of the first deposition head is opened to supply the cleaning gas, only the first exhaust unit may be opened, or both the first and second exhaust units may be opened.

In performing the cleaning, at least one of the first, second or third nozzles may be opened to supply the cleaning gas. At least one of a first exhaust unit adjacent to the first nozzle or a second exhaust unit adjacent to the third nozzle may be opened.

When the method of depositing a film through supply of a mixture gas is selected, the method may include depositing the film on the object by introducing a mixture gas. The method may include cleaning the inside of a chamber by supplying the cleaning gas.

The mixture gas may be supplied via the third nozzle of the second deposition head.

In performing the cleaning, the cleaning gas may be supplied to the third nozzle by opening a second cleaning gas valve. The third nozzle may be cleaned while eliminating a remaining mixture gas by opening a third exhaust unit adjacent to the third nozzle.

BRIEF DESCRIPTION OF THE DRAWINGS

A more complete appreciation of the present invention will become more apparent by describing in detail exemplary embodiments thereof with reference to the accompanying drawings, n which.

DETAILED DESCRIPTION

Figure 1:
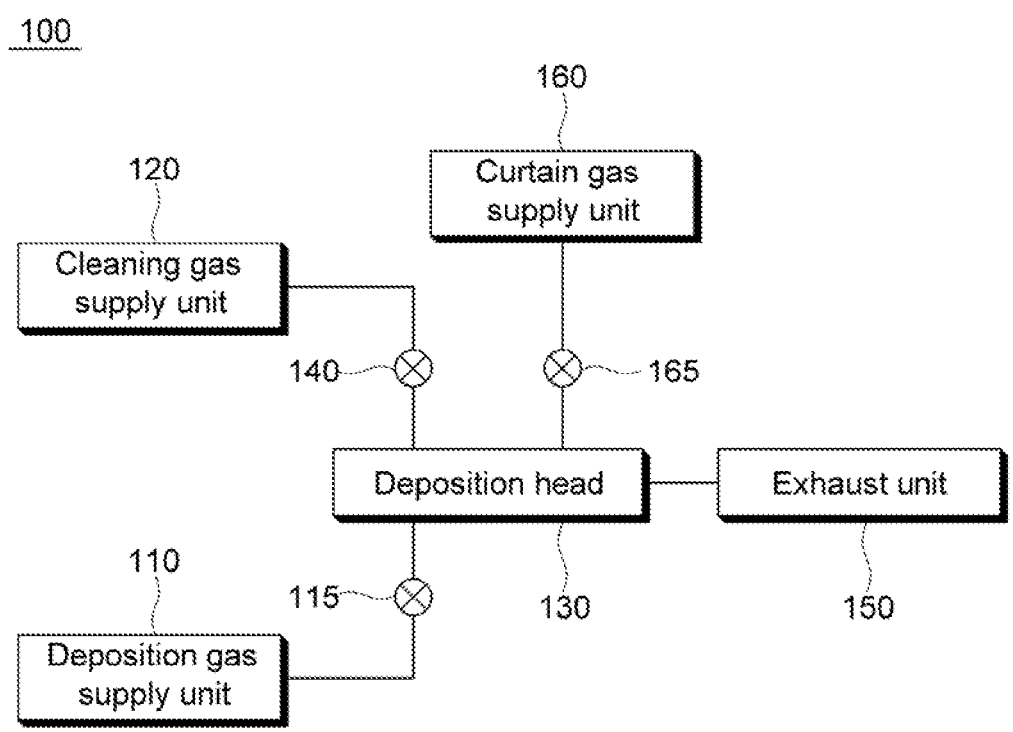
FIG. 1 is a block diagram of a deposition apparatus according an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

In the drawings, thicknesses of layers (e.g., of a plurality of layers) and areas may be exaggerated for clarity of description. It will be understood that although the terms "first" and "second" may be used herein to describe various components, these components should not be limited by these terms.

Figure 2:
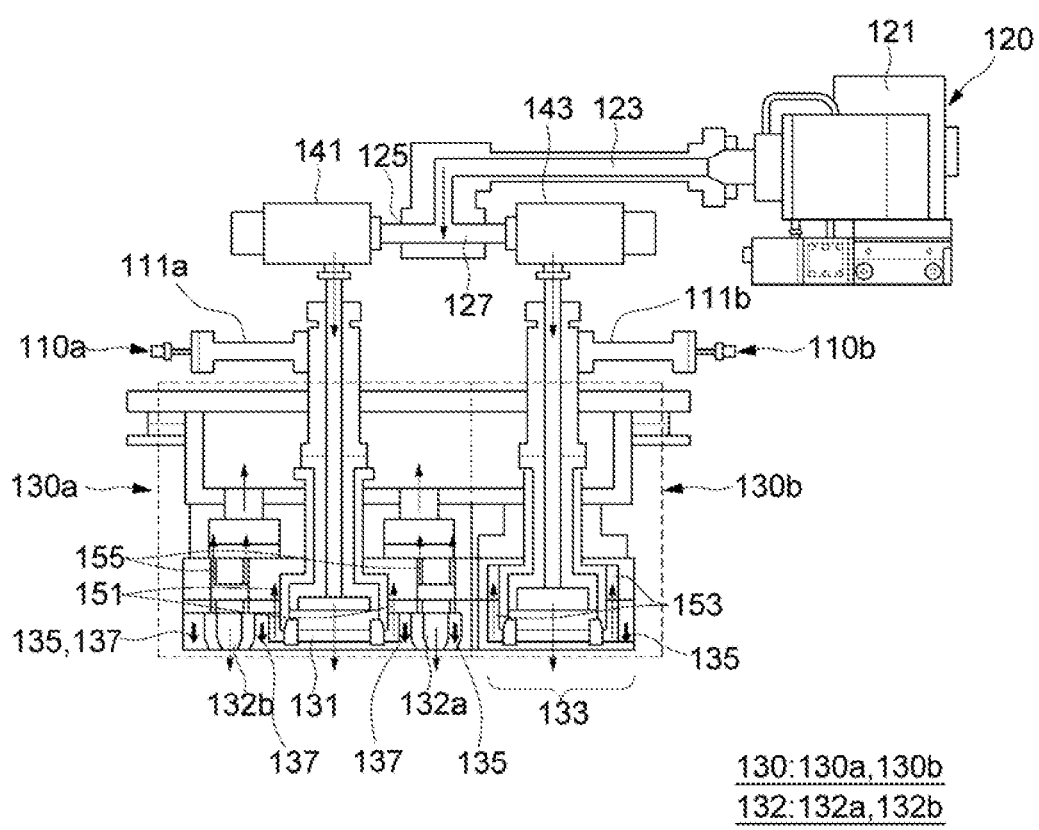
FIG. 2 is a cross-sectional view of a deposition apparatus according to an exemplary embodiment of the present invention.
Figure 3:
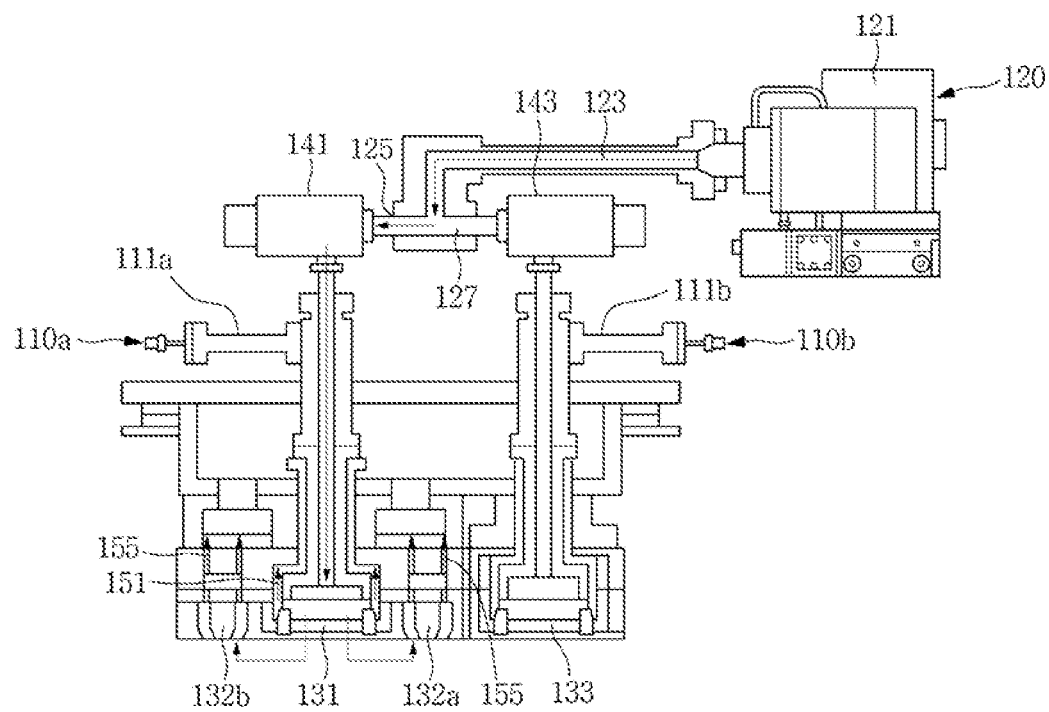
FIG. 3 is a cross-sectional view of a deposition apparatus according to an exemplary embodiment of the present invention.
Figure 4:
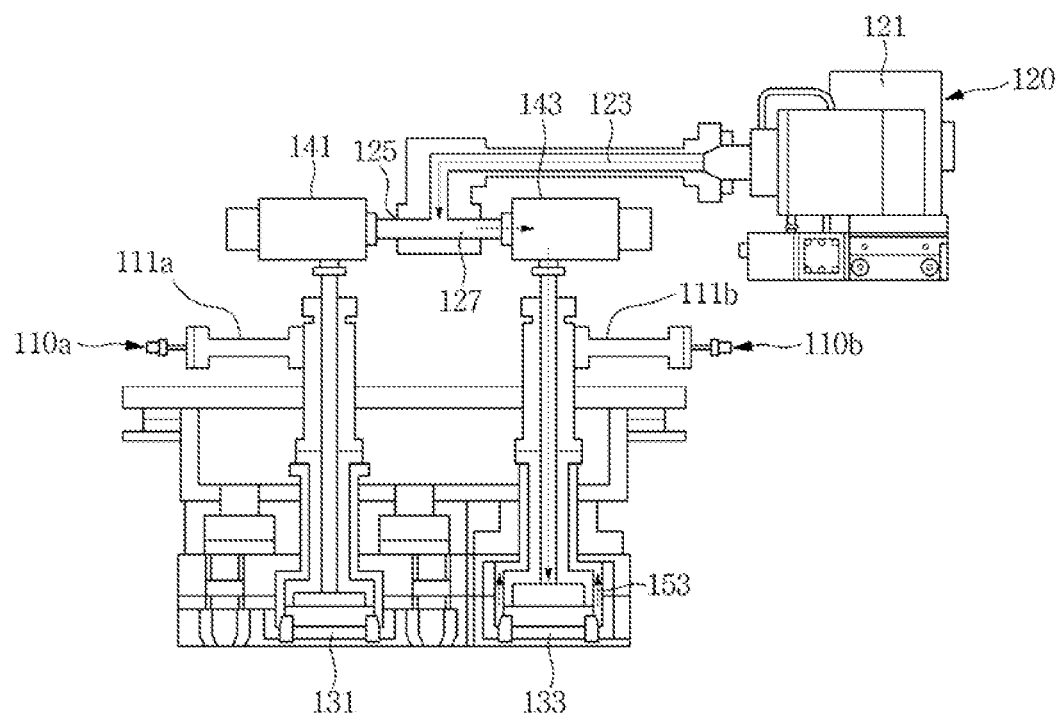
FIG. 4 is a cross-sectional view of a deposition apparatus according to an exemplary embodiment of the present invention.
Figure 5:
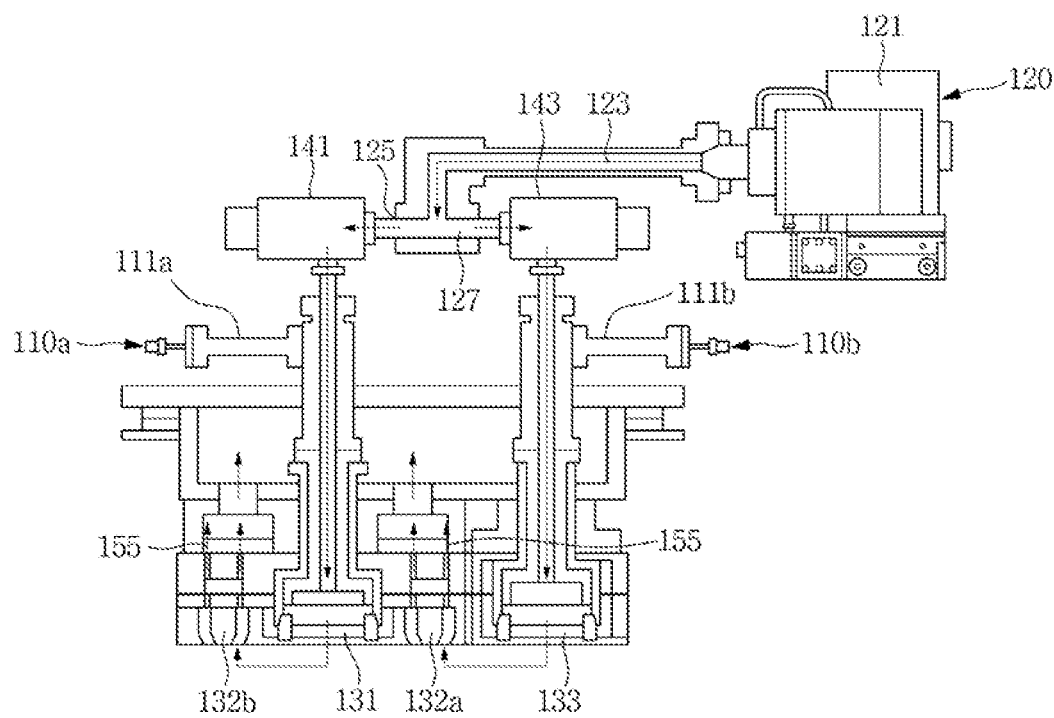
FIG. 5 is a cross-sectional view of a deposition apparatus according to an exemplary embodiment of the present invention.

FIG. 1 is a block diagram of a deposition apparatus according an exemplary embodiment of the present invention. FIG. 2 is a cross-sectional view of a deposition apparatus according to an exemplary embodiment of the present invention. FIG. 3 is a cross-sectional view of a deposition apparatus according to an exemplary embodiment of the present invention. FIG. 4 is a cross-sectional view of a deposition apparatus according to an exemplary embodiment of the present invention. FIG. 5 is a cross-sectional view of a deposition apparatus according to an exemplary embodiment of the present invention.

Referring to FIGS. 1 to 5, a deposition apparatus 100 according to an exemplary embodiment of the present invention may include a deposition gas supply unit 110, a cleaning gas supply unit 120, a deposition head 130, a cleaning gas valve unit 140, an exhaust unit 150, and a curtain gas supply unit 160. The cleaning gas valve 140 unit may be disposed between the cleaning gas supply unit 120 and the deposition head and may selectively transmit cleaning gas to the deposition head.

Deposition gas included in the deposition gas supply unit 110 may be selectively removed from the deposition gas supply unit 110 via an opening and closing valve 115. Thus, the deposition gas supply unit 110 may selectively supply a source gas and/or a mixture gas to the deposition head 130. The source gas and/or the mixture gas may be used to deposit a film on an object (e.g., a substrate) positioned within a chamber.

The opening and closing of the opening and closing valve 115 may be controlled in accordance with the sequence of a process performed within the chamber under the control of a central control unit (CCU). The CCU may include a computer including a computer processor and a memory. The memory may store computer instructions and the processor may execute the computer instructions to selectively supply the source gas and/or the mixture gas to the deposition head 130.

The deposition gas supply unit 110 may include a first deposition gas supply unit 110a configured to supply a source gas and a second deposition gas supply unit 110b configured to supply a mixture gas. The mixture gas may include, for example, a mixture of two or more deposition gases. The deposition gases included in the mixture gas may be included in the mixture gas in substantially equal proportions to each other; however, exemplary embodiments of the present invention are not limited thereto. For example, the proportions of each deposition gas included in the mixture gas may be modified, as desired.

The first deposition gas supply unit 110a may be connected to a first deposition head 130a, including a first nozzle 131. The first deposition head(130a) may also include a second nozzle 132 The first deposition gas supply unit 110a may be connected to the first deposition head including the first nozzle 131 via a first supply pipe 111a. The second deposition gas supply unit 110b may be connected to a second deposition head 130b, including a third nozzle 133, via a second supply pipe 111b.

The deposition apparatus 100 according to an exemplary embodiment of the present invention may be a hybrid deposition apparatus. The hybrid deposition apparatus may be configured to perform atomic layer deposition (ALD) including substantially uniformly forming a fine pattern having a thickness on the order of an atomic size, thus forming a film on an object (e.g., a substrate). The hybrid deposition apparatus may be configured to perform chemical vapor deposition (CVD) by selectively performing a chemical reaction to deposit a film on an object (e.g., a substrate).

ALD (atomic layer deposition) may be a method in which a source gas is introduced into a process chamber, part of the source gas may be physically adsorbed onto a substrate, a remaining gas may be removed through purging, and then deposition may be re-performed by introducing another source gas. Thus, ALD may include a series of deposition procedures to form a film on a substrate, and each deposition procedure may include providing a gas and then purging the gas from a process chamber.

For example, in the case where an atomic layer is formed using two source gases, a process may include depositing an atomic layer attributable to a first source gas on a substrate by introducing the first source gas into a chamber and then eliminating a non-deposited first source gas from the reaction chamber by introducing a cleaning gas into the chamber. Thereafter, an atomic layer attributable to a second source gas may be deposited by introducing a second source gas into the chamber, and a non-deposited second source gas may be eliminated from the chamber by introducing a cleaning gas into the chamber. Accordingly, the atomic layer attributable to the first source gas and the atomic layer attributable to the second source gas may be combined into a thin film having desired properties.

Referring to FIG. 3, in the deposition apparatus 100 according to an exemplary embodiment of the present invention, a first deposition gas supply unit 110a may sequentially supply a first source gas and a second source gas The first source gas may be supplied to a first source gas supply line (e.g., first supply pipe 111a), and may be discharged via a first nozzle 131. The second source gas may be supplied to a second source gas supply line formed separately from the first source gas supply line, and may be discharged via a second nozzle 132.

The first deposition gas supply unit 110a may sequentially supply the first source gas and the second source gas to the first deposition head 130a through an opening and closing valve 115. The opening and closing valve 115 may be positioned between the first deposition gas supply unit 110a and the first nozzle 131. Thus, the opening and closing valve 115 may be used to selectively supply the first and/or second source gases to the first nozzle 131 and or the second nozzle 132.

A second deposition gas supply unit 110b may supply a mixture gas (e.g., for CVD) to the third nozzle 133 of a second deposition head 130b. A second opening and closing valve 115 may be positioned between the second deposition gas supply unit 110b and the third nozzle 133. Thus, the second opening and closing valve 115 may be used to selectively supply the mixture gas to the third nozzle 133.

As an example, when both ALD and CVD are substantially simultaneously performed, ALD may be performed in such a manner that the first deposition gas supply unit 110a supplies a source gas to the first deposition head 130a, and CVD may be performed in such a way that the second deposition gas supply unit 110b supplies a mixture gas to the second deposition head 130b.

As an example, one of ALD or CVD using a chemical reaction may be performed.

Referring to FIG. 4, according to an exemplary embodiment of the present invention, the deposition apparatus 100 may perform only CVD in such a manner that a second deposition gas supply unit 110b supplies a mixture gas to a second deposition head 130b.

Referring to FIG. 5, in the deposition apparatus 100 according to an exemplary embodiment of the present invention, the first deposition gas supply unit 110a may supply a first source gas and the second deposition gas supply unit 110b may supply a second source gas, in a sequential manner.

As an example, the first source gas may be supplied to the first deposition head 130a, and the second source gas may be supplied to the second deposition head 130b. As an example, the overall deposition process may be performed by ALD.

The cleaning gas supply unit 120 may supply a cleaning gas into a chamber.

The cleaning gas supply unit 120 may be a remote plasma source (RPS), and may selectively supply a cleaning gas to the first nozzle 131 and/or the third nozzle 133. For example, the cleaning gas might be selectively supplied to only one of the first nozzle 131 or the third nozzle 133. Alternatively, the cleaning gas may be selective supplied to each of the first nozzle 131 and the third nozzle 133. The cleaning gas may be supplied to each of the first nozzle 131 and the third nozzle 133 at substantially the same time, or at different times from each other. As an example, the cleaning gas might be supplied to the first nozzle 131 or the third nozzle 133 after the first nozzle 131 or the third nozzle 133 is used to discharge a source gas or a mixture gas. Thus, each of the first nozzle 131 and the third nozzle 133 may be cleaned by discharging the cleaning gas.

The cleaning gas supply unit 120 may include a cleaning gas supply tank 121, a cleaning gas supply pipe 123 connected to the cleaning gas supply tank 121, a first connection pipe 125 connected to a first cleaning gas valve 141, and a second connection pipe 127 (see, e.g., FIG. 3) connected to a second cleaning gas valve 143. The first cleaning gas valve 141 and the second cleaning gas valve 143 may be used to selectively supply the cleaning gas to the first nozzle 131 or the third nozzle 133, respectively.

A cleaning gas supplied by the cleaning gas supply unit 120 may be supplied to the first nozzle 131, may be supplied to the third nozzle 133, or may be supplied to both the first and third nozzles 131 and 133, through the opening and closing operation of the cleaning gas valve unit 140.

The deposition head 130 may supply deposition materials (e.g., a source gas, or a mixture gas), or may supply a cleaning gas to an object (e.g., an object, such as a substrate in a process chamber).

The first deposition head may include the first nozzle 131 configured to discharge a first source gas and a cleaning gas, and a second nozzle 132 configured to discharge a second source gas. Thus, the first deposition head may discharge a first source gas and a second source gas.

The second nozzle 132 may include a first side nozzle 132a disposed on one side of the first nozzle 131 and a second side nozzle 132b formed on another side (e.g., an opposite side) of the first nozzle 131. Alternatively, the second nozzle 132 may include one nozzle, or three or more nozzles (e.g., based on a size of an object to be processed in a process chamber).

The second deposition head 130b including the third nozzle 133 may be configured to discharge a mixture gas or a cleaning gas. For example, the cleaning gas may be discharged through the third nozzle 133 after the mixture gas is discharged. Thus, the third nozzle 133 may be cleaned by discharging the cleaning gas.

As an example, the first deposition head 130a and the second deposition head 130b may be separated from each other (e.g., spaced apart from each other), and, thus, may prevent deposition gases (e.g., a source gas and a mixture gas) from being mixed with each other during the performance of a process, such as forming a film on a substrate.

As an example, a first curtain nozzle 135 configured to supply a curtain gas used to form an air curtain may be disposed between the first deposition head 130a and the second deposition head 130b.

Thus, according to an exemplary embodiment of the present invention, both ALD designed to deposit a film on an object (e.g., a substrate) and CVD using a chemical reaction may be substantially simultaneously performed within a single chamber.

A second curtain nozzle 137 configured to supply a curtain gas used to form an air curtain may be disposed between the first nozzle 131 and the second nozzle 132.

Accordingly, an abnormal inter-gas mixture reaction can be prevented from occurring between the first nozzle 131 and the second nozzle 132.

A curtain gas supplied by the curtain gas supply unit 160 may be supplied to the first and/or second curtain nozzles 135 and 137 through the opening and closing operation of the curtain gas opening and closing valve 165. Thus, the curtain gas may be selectively supplied to the first or second curtain nozzles 135 and 137.

The cleaning gas valve unit 140 may be selectively opened and closed to supply a cleaning gas to at least one of the first deposition head 130a and/or the second deposition head 130b.

The opening and closing of the cleaning gas valve unit 140 may be controlled in accordance with the sequence of a process performed within the chamber under the control of a CCU. The CCU is described above in more detail.

The cleaning gas valve unit 140 may include the first cleaning gas valve 141 configured to selectively supply a cleaning gas to the first deposition head including the first nozzle 131, and a second cleaning gas valve 143 configured to selectively supply a cleaning gas to the second deposition head including the third nozzle 133.

The first cleaning gas valve 141 may be disposed on the first connection pipe 125 branched off from the cleaning gas supply pipe 123 connected to the cleaning gas supply tank 121, and the second cleaning gas valve 143 may be disposed on the second connection pipe 127 branched off from the cleaning gas supply pipe 123 connected to the cleaning gas supply tank 121.

The cleaning gas valve unit 140 may be selectively opened and closed to supply a cleaning gas to the first deposition head 130a and/or the second deposition head 130b.

As an example, referring to FIG. 3, when a first source gas supplied to the first nozzle 131 of the first deposition head is a reaction source and a second source gas supplied to the third nozzle 133 of the second deposition head is a reaction gas, the first deposition head 130a may be contaminated, and the second deposition head 130b might not be contaminated.

In this case, only the first deposition head 130a may be cleaned by closing the second cleaning gas valve 143 and opening the first cleaning gas valve 141. Thus, time may be saved by only cleaning one nozzle, material costs may be reduced, and process efficiency may be increased.

Further, when nitriding is performed in the first nozzle 131 and CVD accompanied by the supply of a mixture gas is performed in the third nozzle 133 (see, e.g., FIG. 4), the first deposition head 130a might not be contaminated and the second deposition head 130b may be contaminated. Thus, only the third nozzle 133 may be cleaned and the first nozzle 131 might not be cleaned.

For example, the third nozzle 133 might be intensively cleaned by closing the first cleaning gas valve 141 and opening the second cleaning gas valve 143.

Referring to FIG. 5, the cleaning gas valve unit 140 may open the first and second cleaning gas valves 141 and 143 so that a cleaning gas can be substantially simultaneously supplied to both the first deposition head 130a and the second deposition head 130b.

For example, ALD may be performed via the first deposition head 130a and, substantially simultaneously, CVD may be performed via the second deposition head 130b. When a first source gas supplied to the first nozzle 131 of the first deposition head 130a is a reaction source and a second source gas supplied to the third nozzle 133 of the second deposition head 130b is a reaction gas, the first deposition head 130a may be contaminated and the second deposition head 130b may be also contaminated.

In this case, both the first deposition head 130a and the second deposition head 130b may be substantially simultaneously cleaned by substantially simultaneously opening both the first cleaning gas valve 141 and the second cleaning gas valve 143.

The exhaust unit 150 may discharge a cleaning gas and remaining source and mixture gases from the chamber to the outside.

The exhaust unit 150 includes a first exhaust unit 151 disposed adjacent to the first nozzle 131, a second exhaust unit 155 disposed adjacent to the second nozzle 132, and a third exhaust unit 153 disposed adjacent to the third nozzle 133 of the second deposition head 130b.

The opening and closing of the exhaust unit 150 may be also controlled in accordance with the sequence of a process performed within the chamber under the control of the CCU. The CCU is described above in more detail.

When the first nozzle 131 of the first deposition head 130a is opened to supply a cleaning gas (see, e.g., FIG. 3), only the first exhaust unit 151 may be opened, or both the first and second exhaust units 151 and 155 may be opened.

As an example, when only the first deposition head 130a is cleaned, the first nozzle 131 may be cleaned while eliminating a remaining source gas by opening only the first exhaust unit 151. Alternatively, both the first nozzle 131 and the second nozzle 132 may be cleaned while eliminating a remaining source gas by opening both the first exhaust unit 151 and the second exhaust unit 155.

When the third nozzle 133 of the second deposition head 130b is opened to supply a cleaning gas during CVD (see, e.g., FIG. 4), the third exhaust unit 153 may be opened, and thus the third nozzle 133 may be cleaned while eliminating a remaining mixture gas from the chamber.

When the first nozzle 131 of the first deposition head and the third nozzle 133 of the second deposition head are substantially simultaneously opened to supply a cleaning gas (see, e.g., FIG. 5), the second exhaust unit 155 may be opened, and thus an air current may be formed such that a cleaning gas supplied by the first and third nozzles 131 and 133 is directed to the second exhaust unit 155. This air current may be used to eliminate a remaining source gas within the chamber and to also clean the second nozzle 132. The first and third exhaust units 151 and 155 may be also opened such that the first and third nozzles 131 and 133 are cleaned.

Accordingly, according to an exemplary embodiment of the present invention, process time can be reduced by selecting and intensively cleaning only a portion expected to be contaminated (e.g., by selectively cleaning less than all of the nozzles), and also a second nozzle can be intensively cleaned by substantially simultaneously supplying a cleaning gas to the deposition heads and opening the second exhaust unit.

A deposition method according to an exemplary embodiment of the present invention will be described in more detail below.

The deposition method according to an exemplary embodiment of the present invention may include depositing a film on an object via the deposition head 130 including the first deposition head 130a configured to supply a source gas and a cleaning gas and the second deposition head 130b configured to supply a source gas, a mixture gas, and a cleaning gas.

The deposition method may include the step of selecting any one of a method of depositing a film through the supply of a source gas and a method of depositing a film through the supply of a mixture gas.

As an example, any one of ALD and CVD may be selected.

However, it will be apparent that ALD may be performed via the first deposition head 130a and, substantially simultaneously, CVD may be performed via the second deposition head 130b.

When the method of depositing a film through the supply of a source gas (e.g., ALD), is selected, step of depositing a film on an object by introducing a source gas may be performed.

The step of depositing a film may include a first introduction step of introducing a first source gas through the control of the opening and closing valve 115 included in the deposition gas supply unit 110, and a second introduction step of introducing a second source gas through the control of the opening and closing valve 115 included in the deposition gas supply unit 110.

At the first introduction step, the first source gas may be supplied to the first nozzle 131 of the first deposition head 130a, and at the second introduction step, the second source gas may be supplied to the second nozzle 132 of the first deposition head 130a.

Alternatively, at the first introduction step, the first source gas may be supplied to the first nozzle 131 of the first deposition head 130a, and at the second introduction step, the second source gas may be supplied to the third nozzle 133 of the second deposition head 130b.

Thereafter, the step of performing cleaning by supplying a cleaning gas may be performed.

The step of performing cleaning may include the step of introducing a cleaning gas by opening the cleaning gas valve unit 140 during or after the performance of the first and second introduction steps, and the step of cleaning the deposition head 130 while eliminating remaining first and second source gases by opening the exhaust unit 150.

At the step of performing cleaning, when the first nozzle 131 of the first deposition head 130a is opened to supply a cleaning gas, only the first exhaust unit 151 may be opened, or both the first and second exhaust units 151 and 155 may be opened.

When only the first exhaust unit 151 is opened, only the first nozzle 131 may be cleaned. When both the first and second exhaust units 151 and 155 are opened, both the first nozzle 131 and the second nozzle 132 may be cleaned.

At the step of performing cleaning in the case where the first source gas is supplied to the first nozzle 131 of the first deposition head 130a at the first introduction step and the second source gas is supplied to the third nozzle 133 of the second deposition head 130b at the second introduction step, when opening is performed such that a cleaning gas can be supplied to at least one of the first and third nozzles 131 and 133, at least one of the first exhaust unit 151 adjacent to the first nozzle and the third exhaust unit 153 adjacent to the third nozzle may be opened, and thus at least one of the first and third nozzles 131 and 133 may be cleaned while eliminating a remaining source gas.

When a cleaning gas is supplied to both the first and third nozzles 131 and 133, only the second exhaust unit 155 may be opened (e.g., to clean the second nozzle 132).

At the step of selecting any one of a method of depositing a film through the supply of a source gas and a method of depositing a film through the supply of a mixture gas, the method of depositing a film through the supply of a mixture gas (e.g., CVD), may be selected.

In this case, the step of depositing a film on the object may be performed by introducing a mixture gas and the step of cleaning the inside of the chamber by supplying a cleaning gas may be performed.

In this case, the mixture gas may be supplied via the third nozzle 133 of the second deposition head 130b, and nitriding may be performed in the first nozzle 131. Accordingly, the first deposition head 130a might not be contaminated, and the second deposition head 130b may be contaminated.

In this case, only the second deposition head 130b may be cleaned by closing the first cleaning gas valve 141 and opening the second cleaning gas valve 143.

As an example, a cleaning gas may be supplied to the third nozzle 133 by opening the second cleaning gas valve 143, and the third nozzle 133 may be cleaned while eliminating a remaining mixture gas by opening the third exhaust unit 153 adjacent to the third nozzle 133.

ALD may be performed via the first deposition head 130a and, substantially simultaneously, CVD may be performed via the second deposition head 130b.

In this case, the first nozzle 131, the second nozzle 132, and the third nozzle 133 may be cleaned while eliminating remaining source and mixture gases by opening both the first cleaning gas valve 141 and the second cleaning gas valve 143 and also opening all the first to third exhaust units 151, 153, and 155.

Further, in the case of the simultaneous process, only the second exhaust unit 155 may be opened to clean the second nozzle 132.

According to an exemplary embodiment of the present invention, process time can be reduced by selecting and intensively cleaning only a portion expected to be contaminated, and also a second nozzle can be intensively cleaned by substantially simultaneously supplying a cleaning gas to deposition heads and opening a second exhaust unit.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A deposition apparatus comprising:
a deposition gas supply unit comprising an opening and closing valve, and configured to selectively supply a source gas or a mixture gas into a chamber;
a cleaning gas supply unit configured to supply a cleaning gas into the chamber;
a deposition head including a first deposition head configured to supply the source gas and the cleaning gas and a second deposition head configured to supply the source gas, the mixture gas, and the cleaning gas;
an exhaust unit configured to discharge the cleaning gas and remaining source and mixture gases from the chamber; and a cleaning gas valve unit configured to be selectively opened and closed to supply the cleaning gas to at least any one of the first deposition head and the second deposition head, wherein a first nozzle is connected to the deposition gas supply unit and the cleaning gas supply unit, wherein the deposition gas supply unit is a separate source of gas from that of the cleaning gas supply unit, wherein the cleaning gas supply unit is connected to a cleaning gas supply pipe, wherein the cleaning gas supply pipe is directly connected to a first connection pipe and a second connection pipe, wherein the first connection pipe is directly connected to a first cleaning gas valve of the cleaning gas valve unit, and wherein the second connection pipe is directly connected to the second cleaning, as valve of the cleaning gas valve unit.

2. The deposition apparatus of claim 1, wherein
the first cleaning gas valve configured to selectively supply the cleaning gas to the first deposition head, and
the second cleaning gas valve is configured to selectively supply the cleaning gas to the second deposition head.

3. The deposition apparatus of claim 1, wherein
the first nozzle is configured to selectively supply a first source gas and the cleaning gas, and
a second nozzle is configured to selectively supply a second source gas different from the first source gas.

4. The deposition apparatus of claim 1, wherein the second deposition head comprises a third nozzle configured to supply the mixture gas and the cleaning gas.

5. The deposition apparatus of claim 1, further comprising a first curtain nozzle disposed between the first deposition head and the second deposition head and configured to supply a curtain gas.

6. The deposition apparatus of claim 3, wherein the first deposition head further comprises a second curtain nozzle disposed between the first nozzle and the second nozzle and configured to supply a curtain gas.

7. The deposition apparatus of claim 3, wherein the exhaust unit comprises:
a first exhaust unit disposed adjacent to the first nozzle;
a second exhaust unit disposed adjacent to the second nozzle; and
a third exhaust unit disposed adjacent to the second deposition head.

8. The deposition apparatus of claim 1, wherein the cleaning gas valve unit is selectively opened and closed to selectively supply the cleaning gas to the first deposition head or the second deposition head.

9. The deposition apparatus of claim 1, wherein the cleaning gas valve unit is opened to substantially simultaneously supply the cleaning gas to both the first deposition head and the second deposition head.

10. The deposition apparatus of claim 7, wherein when the first nozzle of the first deposition head is opened to supply the cleaning gas, only the first exhaust unit is opened, or both the first and second exhaust units are opened.

11. The deposition apparatus of claim 7, wherein when a third nozzle of the second deposition head is opened to supply the cleaning gas, the third exhaust unit is opened.

12. A deposition apparatus comprising:
a first deposition gas supply unit connected with a first nozzle through a first supply pipe;
a second deposition gas supply unit connect with a second nozzle through a second supply pipe spaced apart from the first supply pipe;
an exhaust unit configured to discharge a remaining gas surrounding the first nozzle or the second nozzle;
a cleaning gas supply tank connected with the first nozzle through a first cleaning gas valve and to the second nozzle through a second cleaning gas valve,
wherein the cleaning gas supply tank comprises a cleaning gas supply pipe connecting the cleaning gas supply tank with the first cleaning gas valve and the second cleaning gas valve through a connection pipe including a first connection pipe and a second connection pipe, wherein the cleaning gas supply tank is connected to the cleaning gas supply pipe, wherein the cleaning as supply pipe is directly connected to the first connection pipe and the second connection pipe, wherein the first connection pipe is directly connected to the first cleaning gas valve, and the second connection pipe is directly connected to the second cleaning gas valve,
wherein the first cleaning gas valve and the second cleaning gas valve are respectively configured to selectively supply a cleaning gas to the first nozzle or the second nozzle to individually clean the first nozzle or the second nozzle,
wherein the first deposition gas supply unit is a separate source of gas from that of the cleaning gas supply tank.

13. The deposition apparatus of claim 1, wherein the gas supply pipe is connected to the first nozzle, the deposition gas supply unit and the cleaning gas supply unit.

14. The deposition apparatus of claim 12, wherein a third supply pipe is connected to the first nozzle and the first cleaning gas valve, and the first supply pipe is not directly connected with the first nozzle and the first cleaning gas valve.

* * * * *